United States Patent
Yang et al.

(10) Patent No.: US 9,502,134 B2
(45) Date of Patent: Nov. 22, 2016

(54) SHIFT REGISTER, METHOD FOR DRIVING THE SAME, AND ARRAY SUBSTRATE

(71) Applicants: HEFEI BOE OPTOELECTRONICS TECHNOLOGY CO., LTD., Anhui (CN);
(Continued)

(72) Inventors: Tong Yang, Beijing (CN); Rui Ma, Beijing (CN); Xianjie Shao, Beijing (CN); Ming Hu, Beijing (CN)

(73) Assignees: HEFEI BOE OPTOELECTRONICS TECHNOLOGY CO., LTD., Hefei, Anhui (CN);
(Continued)

( * ) Notice: Subject to any disclaimer, the term of this patent is extended or adjusted under 35 U.S.C. 154(b) by 218 days.

(21) Appl. No.: 14/041,293

(22) Filed: Sep. 30, 2013

(65) Prior Publication Data
US 2014/0119490 A1    May 1, 2014

(30) Foreign Application Priority Data

Sep. 28, 2012  (CN) .......................... 2012 1 0370531

(51) Int. Cl.
*G11C 19/00* (2006.01)
*G11C 19/28* (2006.01)
*G09G 3/36* (2006.01)

(52) U.S. Cl.
CPC ............. *G11C 19/28* (2013.01); *G09G 3/3677* (2013.01); *G09G 2310/0202* (2013.01); *G09G 2310/0286* (2013.01)

(58) Field of Classification Search
None
See application file for complete search history.

(56) References Cited

U.S. PATENT DOCUMENTS 7,859,507 B2 * 12/2010 Jang et al. ..................... 345/100
7,911,436 B2 *  3/2011 Lee et al. ...................... 345/100
(Continued)

FOREIGN PATENT DOCUMENTS

| CN | 101477836 A | 7/2009 |
|----|-------------|--------|
| CN | 102087827 A | 6/2011 |
| CN | 102651187 A | 8/2012 |

OTHER PUBLICATIONS

Partial European Search Report Dated Feb. 28, 2014 Appln. No. EP 13 18 6683.
(Continued)

*Primary Examiner* — Tuan T Lam
(74) *Attorney, Agent, or Firm* — Ladas & Parry LLP

(57) ABSTRACT

The disclosure relates to a shift register, a method for driving the same, an array substrate and a display apparatus, for reducing the wiring space as required by the shift register. The shift register comprising a control unit and a plurality of output sub-units, wherein the control unit comprises a plurality of output terminals which output gate line control signals sequentially according to the control timing sequence during a first preset time period, and output the gate line control signals sequentially according to the control timing sequence during a second preset time period in an order opposite to or identical to an order in which the gate line control signals are output during the first preset time period; each of the output sub-units is connected to a corresponding output terminal of the control unit, and divides the gate line control signal output from the connected output terminal into at least a first gate line control signal and a second gate line control signal, and outputs the first gate line control signal and the second gate line control signal respectively.

14 Claims, 10 Drawing Sheets

(71) Applicants: BOE TECHNOLOGY GROUP CO., LTD., Beijing (CN)

(73) Assignees: BOE TECHNOLOGY GROUP CO., LTD., Beijing (CN)

(56) References Cited

U.S. PATENT DOCUMENTS

| | | | |
|---|---|---|---|
| 2003/0002615 A1* | 1/2003 | Morosawa et al. | 377/64 |
| 2003/0227433 A1 | 12/2003 | Moon | |
| 2006/0267909 A1* | 11/2006 | Hsu et al. | 345/100 |
| 2007/0297559 A1* | 12/2007 | Cho et al. | 377/64 |
| 2008/0012818 A1* | 1/2008 | Lee et al. | 345/100 |
| 2008/0187089 A1 | 8/2008 | Miyayama et al. | |
| 2008/0316159 A1 | 12/2008 | Qi et al. | |
| 2009/0167668 A1 | 7/2009 | Kim | |
| 2010/0067646 A1* | 3/2010 | Liu et al. | 377/69 |
| 2010/0220082 A1* | 9/2010 | Lin et al. | 345/205 |
| 2012/0293467 A1* | 11/2012 | Lee et al. | 345/204 |
| 2012/0293737 A1 | 11/2012 | Li et al. | |
| 2013/0077736 A1* | 3/2013 | Son | 377/69 |
| 2014/0254743 A1* | 9/2014 | Jang et al. | 377/64 |

OTHER PUBLICATIONS

First Chinese Office Action Appln. No. 201210370531.0; Dated Sep. 17, 2014.
Second Chinese Office Action Appln. No. 201210370531.0; Dated Jan. 26, 2015.
Extended European Search Report Issued Jul. 22, 2014; Appln. No. EP 13 18 6683.
Third Chinese Office Action dated Jun. 5, 2015; Appln. No. 201210370531.0.
EPO Office Action dated Jul. 11, 2016; Appln. No. 13 186 683.2-1904.

\* cited by examiner

SHIFT REGISTER, METHOD FOR DRIVING THE SAME, AND ARRAY SUBSTRATE

TECHNICAL FIELD

The disclosure relates to technical field of a tablet display, particularly to a shift register, a method for driving the same, and an array substrate.

BACKGROUND

A tablet display has been developing very rapidly due to advantages such as ultra thin thickness and energy saving. Shift registers are adopted in most of tablet displays. At present, by means of the shift register implemented with the technique of Gate on Array (GOA), not only the cost is saved, but also one process in manufacturing the display panel can be omitted. Thus, in recent years, the technique of GOA is widely applied to the process for manufacturing the tablet display.

A design scheme of a current GOA is shown in FIG. 1 and it includes a plurality of shift register units connected in concatenation $U_1, U_2, U_3, \ldots, U_N$. An output signal of each unit $U_n(1<n<N)$ is supplied to a corresponding gate line G_n, and also supplied to an adjacent previous shift register unit $U_{n-1}$ and an adjacent next shift register unit $U_{n+1}$ for resetting the previous shift register unit $U_{n-1}$ and starting the next shift register unit $U_{n+1}$ respectively, wherein the shift register unit at the first stage is supplied with a start pulse signal STP. Each shift register unit is supplied with a reference signal Vss, wherein the odd-numbered shift register units are supplied with a clock signal CLK and the even-numbered shift register units are supplied with a clock signal CLKB.

In a design scheme in the prior art, since each GOA unit can only control one gate line, the wiring space as required is large, and thus it is hard for such a scheme to be applied especially in a small-sized panel.

SUMMARY

Embodiments of the disclosure provide a shift register, a method for driving the same, an array substrate, and a display apparatus, for reducing the wiring space as required by the shift register.

An embodiment of the disclosure provides a shift register, including a control unit and a plurality of output sub-units, wherein the control unit comprises a plurality of output terminals which output gate line control signals sequentially according to the control timing sequence during a first preset time period, and output gate line control signals sequentially according to the control timing sequence during a second preset time period in an order opposite to an order in which the gate line control signals are output during the first preset time period;

each of the output sub-units is connected to a corresponding output terminal of the control unit, and divides the gate line control signal output from the connected output terminal into at least a first gate line control signal and a second gate line control signal to output the first gate line control signal and the second gate line control signal respectively.

An embodiment of the disclosure provides a method for driving the shift register, comprising steps of:

receiving the gate line control signal output from the control unit, wherein during the first preset time period, the gate line control signal is output sequentially by the control unit according to the control timing sequence; and during the second preset time period, the gate line control signal is output sequentially by the control unit according to the control timing sequence in an order opposite to or identical to the order in which the gate line control signals are output during the first preset time period; and dividing the received gate line control signal into the first gate line control signal and the second gate line control signal to output the first gate line control signal and the second gate line control signal respectively.

An embodiment of the disclosure provides an array substrate comprising the shift register.

An embodiment of the disclosure provides a display apparatus including a color film substrate, an array substrate and the liquid crystal between the color film substrate and the array substrate, wherein the array substrate includes the shift register.

In the shift register, the method for driving the same, the array substrate and the display apparatus provided in the embodiments of the disclosure, the shift register comprises the control unit and the output sub-units, wherein the control unit comprises a plurality of output terminals each connected to a corresponding output sub-unit. The individual output terminals output gate line control signals sequentially according to the control timing sequence during a first preset time period, and output gate line control signals sequentially according to the control timing sequence during a second preset time period in an order opposite to or identical to the order in which the gate line control signals are output during the first preset time period; each of the individual output sub-unit divides the gate line control signal output from the connected output terminal into two gate line control signals and output the two gate line control signals respectively. Thus, one output terminal can output two gate line signals respectively, thus reducing the space for wiring as required by the shift register.

The other features and advantages of the disclosure will be illustrated hereinafter, and they will be apparent from the disclosure and be known from the implementation. The objects and other advantages of the disclosure can be achieved and obtained from the specific structures as described in the description, claims and the accompanying drawings.

BRIEF DESCRIPTION OF THE DRAWINGS

In following description, the features and advantages of the invention will be more apparent in connection with the accompanying drawings. In the whole drawings, the same element is denoted with the same reference number, wherein.

DETAILED DESCRIPTION OF THE PREFERRED EMBODIMENTS

To make the object, technical solution and advantages of the present invention more clear, hereinafter, a detailed description will be further made to the embodiments of the present invention in connection with the appended drawings.

The embodiments of the disclosure provide a shift register, a method for driving the same, an array substrate and a display apparatus, for reducing the wiring space as required by the shift register.

Hereinafter, the embodiments of the disclosure will be described in connection with the accompanying drawings. It should be appreciated that the described embodiments are only for illustrating and explaining the disclosure, not for limiting the present invention in any way. Further, the embodiments of the disclosure and the technical features therein can be combined together if there is no conflict therebetween.

Figure 1:
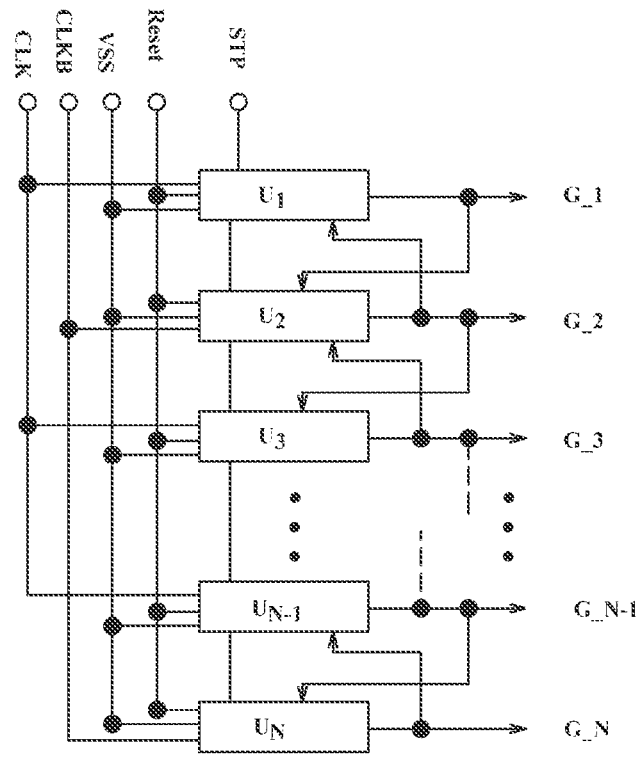
FIG. 1 is a schematic diagram showing a structure of a GOA in prior art.
Figure 2:
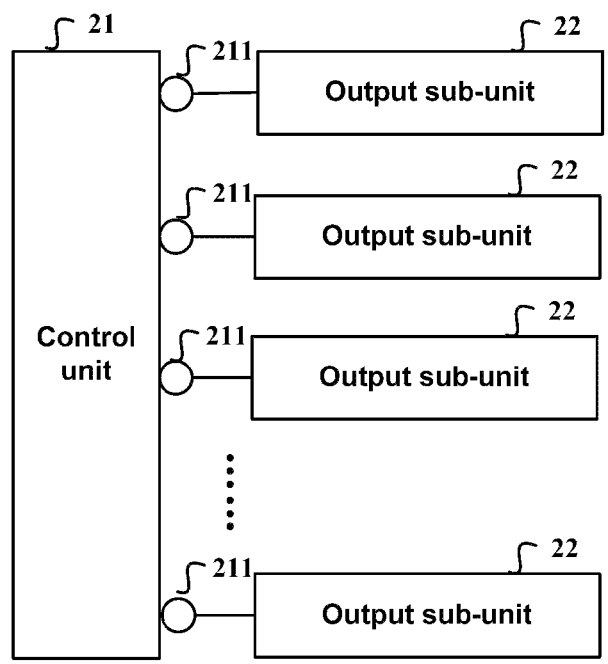
FIG. 2 is a schematic diagram showing a structure of a shift register in an embodiment of the disclosure.

FIG. 2 shows a schematic structure diagram of a shift register provided in an embodiment of the disclosure, wherein the shift register includes a control unit 21 and a plurality of output sub-units 22, and the control unit 21 comprises a plurality of output terminals 211 each connected to a corresponding output sub-unit 22. The individual output terminals output gate line control signals sequentially according to the control timing sequence during a first preset time period, and output gate line control signals sequentially according to the control timing sequence during a second preset time period in an order opposite to or identical to an order in which the gate line control signals are output during the first preset time period; each of the output sub-unit 22 divides the gate line control signal output from the connected output terminal into at least a first gate line control signal and a second gate line control signal and outputs the first gate line control signal and the second gate line control signal respectively.

When the gate line control signals are output sequentially according to the control timing sequence during the second preset time period in an order opposite to the order in which gate line control signals are output during the first preset time period, after the first preset time period ends, a reverse start pulse needs to be input to the control unit, wherein the start pulse can be input manually, and can also be carried out automatically by a system circuit. When the latter is adopted, i.e., it is carried out automatically by a system circuit, the shift register provided in an embodiment of the disclosure can further include a reset unit for inputting a start signal into the control unit 21 after the first preset time period ends, so that the control unit 21 outputs the gate line control signals sequentially according to the control timing sequence during the second preset time period in an order opposite to the order in which the gate line control signals are output during the first preset time period.

In an example, each output sub-unit 22 can output a first gate line control signal sequentially according to the control timing sequence during the first preset time period, and output a second gate line control signal sequentially according to the control timing sequence during the second preset time period in an order opposite to or identical to an order in which the first gate line control signal is output during the first preset time period.

In an example, the first preset time period can be a first half frame of each picture to be displayed, and the second preset time period can be a latter half frame of each picture to be displayed. Thus, the output sub-unit 22 can output a first gate line control signal sequentially according to the control timing sequence in the first half frame of each picture to be displayed, and output a second gate line control signal sequentially according to the control timing sequence in the latter half frame of each picture to be displayed.

In an example, the control unit 21 can include a plurality of control sub-units connected in concatenation inside, wherein each control sub-unit has one output terminal 211 being connected to a corresponding output sub-unit 22 and outputting a gate line control signal; wherein except for the control sub-unit at the first stage and the control sub-unit at the last stage, an output signal from each of the control sub-units $U_n$ (1<n<N, n and N being natural numbers, and N denoting the number of the control sub-units) is provided to the corresponding output sub-unit, and is further provided to an adjacent previous control sub-unit $U_{n-1}$ and an adjacent next control sub-unit $U_{n+1}$. In a forward scanning, i.e., scanning from $U_1$ to $U_n$(1≤n≤N), the output signal functions to reset the adjacent previous control sub-unit $U_{n-1}$ and to input a start signal and a control signal into the adjacent next control sub-unit $U_{n+1}$. In a reverse scanning, i.e., scanning from $U_n$ to $U_1$(1≤n≤N), the output signal functions to input a start signal and a control signal into the adjacent previous control sub-unit $U_{n-1}$ and to reset the adjacent next control sub-unit $U_{n+1}$. Individual control sub-units are connected to a reference signal terminal Vss (for example, a low level terminal Vss). Alternatively, when the output signal from the control sub-unit $U_n$(1<n<N) only functions as a start signal of the control sub-unit $U_{n-1}$ or $U_{n+1}$, the control sub-unit Un is further connected to a control signal line Bi1 or Bi2, wherein a signal from the control signal line Bi1 or Bi2 functions as a control signal of the control sub-unit Un.

The control sub-unit at the first stage is supplied with a start pulse signal STP, and an output terminal of the control sub-unit at the first stage is connected to an input terminal of a shift register unit at the second stage. Certainly, the start pulse signal STP can function as a start signal and a control signal of the control sub-unit at the first stage simultaneously; also, the start pulse signal STP can only function as a start signal of the control sub-unit at the first stage, and meanwhile, the control sub-unit at the first stage is further connected to the control signal line Bi1 or Bi2, wherein a signal from the control signal line Bi1 or Bi2 functions as a control signal of the control sub-unit at the first stage.

In an example, two adjacent control sub-units are connected to the same control signal line Bi1 or Bi2.

In an example, the control sub-unit at each stage can comprise:

A first control module for controlling a pull-up module to be turned on or off, wherein in the forward scanning, the first control module turns on or turns off the pull-up module according to a gate line control signal output from the control sub-unit at the previous stage; in the reverse scanning, the first control module turns on or turns off the pull-up module according to a gate line control signal output from the control sub-unit at the next stage, that is, the first control module is used for performing a resetting function in the reverse scanning;

A second control module for controlling the pull-up module to be turned on or off, wherein in the reverse scanning, the second control module turns on or turns off the pull-up module according to a gate line control signal output from the control sub-unit at the previous stage; in the forward scanning, the second control module turns on or turns off the pull-up module according to a gate line control signal output from the control sub-unit at the next stage, that is, the second control module is used for performing a resetting function in the forward scanning;

the pull-up module for outputting a clock signal to an output terminal of the control sub-unit under the control of the second control module or the first control module; and a pull-down module for pulling down a gate line control signal output from the output terminal of the control sub-unit to a reference signal Vss to prevent the gate line control signal from generating noise.

In an example, the control sub-unit can further include a discharge circuit for pulling down the gate line control signal output from the output terminal of the control sub-unit to the reference signal Vss.

On one hand, the discharge circuit can control the pull-down module to be turned on or off, so as to pull down the gate line control signal output from the output terminal of the control sub-unit to the reference signal Vss;

And on the other hand, the discharge circuit can also pull down the input voltage of the pull-up module (i.e., the voltage at a pull-up node P) to the reference signal Vss, and in turn pulls down the gate line control signal output from the output terminal of the control sub-unit to the reference signal Vss.

At the same time, when the first control module or the second control module performs a resetting function, the discharge circuit can be implemented by the first control module or the second control module which performs the resetting function, or the discharge circuit can receive the reset signal of the first control module or the second control module which performs the resetting function. That is, the discharge circuit pulls down the input voltage of the pull-up module (i.e., the voltage at the node PU) to the reference signal Vss.

It should be noted that a start control signal of the pull-down module can be used as or can be different from the reset signal of the first control module or the second control module which performs the resetting function; the start control signal of the pull-down module can also be used as the start control signal generated by the discharge circuit.

In an example, an output terminal of the control sub-unit at the last stage is connected to a reset signal input terminal thereof and a reset signal input terminal of the control sub-unit at the adjacent previous stage.

Alternatively, in an example, the control unit can further comprise a reset unit, wherein an input terminal of the reset unit is connected to the output terminal of the control sub-unit at the last stage, and an output terminal of the reset unit is connected to a reset terminal of the control sub-unit at the last stage. On one hand, the reset unit is used to reset the control sub-unit at the last stage in the forward scanning; and on the other hand, it can be used to input a start signal to the control unit 21 after the first preset time period ends, so that the control unit 21 outputs the gate line control signals sequentially according to the control timing sequence during the second preset time period in an order opposite to the order in which the gate line control signals are output during the first preset time period.

Preferably, the reset unit includes two redundant control sub-units, wherein the output terminals of the two redundant control sub-units are not connected to the output sub-unit, but are used for outputting a reset signal to the control sub-unit at the last stage or a start signal for reverse scanning to the control sub-unit at the last stage. The structure of the redundant control sub-unit is similar to that of the control sub-unit at each stage.

A first redundant control sub-unit comprises:

a first control module connected to the output terminal of the control sub-unit at the last stage and the control signal line Bi1 or Bi2, for controlling the pull-up module to be turned on or off; for example, in the forward scanning, the first control module turns on or turns off the pull-up module according to the gate line control signal output from the output terminal of the control sub-unit at the last stage and the signal input to the control signal line Bi1 or Bi2;

a pull-up module for outputting a clock signal to an output terminal of the first redundant control sub-unit under the control of the first control module; and a pull-down module for pulling down the gate line control signal output from the output terminal of the first redundant control sub-unit to the reference signal Vss.

A second redundant control sub-unit comprises:

a first control module connected to the output terminal of the first redundant control sub-unit and the control signal line Bi1 or Bi2, for controlling the pull-up module to be turned on or off; for example, in the forward scanning, the first control module turns on or turns off the pull-up module according to the gate line control signal output from the output terminal of the second redundant control sub-unit and the signal input to the control signal line Bi1 or Bi2;

a pull-up module for outputting a clock signal to an output terminal of the second redundant control sub-unit under the control of the first control module; and a pull-down module for pulling down the gate line control signal output from the output terminal of the second redundant control sub-unit to the reference signal Vss;

wherein an output terminal of the second redundant control sub-unit is connected to the second control module of the control sub-unit at the last stage, for supplying the second control module of the control sub-unit at the last stage with a reset signal or a start control signal.

In an example, the above redundant control sub-unit can further comprise a discharge circuit for pulling down the gate line control signal output from the output terminal of the redundant control sub-unit to the reference signal Vss.

Preferably, the discharge circuit in the redundant control sub-unit adopts a circuit structure similar to that of the discharge circuit in the control sub-unit.

Figure 3:
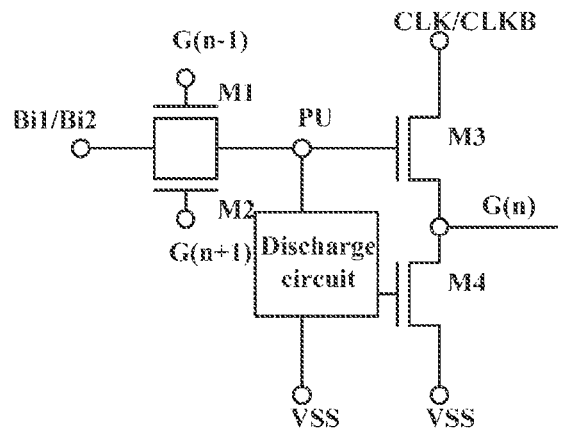
FIG. 3 is a schematic diagram showing a possible structure of a control sub-unit in an embodiment of the disclosure.

FIG. 3 shows a schematic diagram of a structure of each of the plurality of control sub-units connected in concatenation, wherein it includes a control signal line Bi1 or Bi2, a clock signal line (CLK or CLKB), four transistors, a reference signal line VSS, and a discharge circuit. For the sake of simplifying description, in an embodiment of the disclosure, two control signal lines are referred to as Bi1 and Bi2 respectively, two clock signals are referred to as CLK and CLKB, and the four transistors are referred to as $M_1$, $M_2$, $M_3$, and $M_4$ respectively, wherein $M_1$ functions as a first control module, $M_2$ functions as a second control module, $M_3$ functions as a pull-up module and $M_4$ functions as a pull-down module. Individual control sub-units connected in concatenation are referred to as $U_1$, $U_2$, $U_3$, ..., $U_N$ (N being a natural number) respectively in order. The control signal line is used for inputting a control signal, the clock signal line is used for supplying a clock signal, the reference signal line is used for supplying a reference voltage, and the output terminal of each control sub-unit is used for outputting a gate line control signal G(N); and they are connected in a manner as follows:

in each control sub-unit, the gate of transistor $M_1$ is connected to the output terminal of the control sub-unit at the previous stage, and the source thereof is connected to one of the two control signal lines to obtain the corresponding control signal, and the drain thereof is connected to a pull-up node PU; the gate of transistor $M_2$ is connected to the output terminal of the control sub-unit at the next stage, and the drain thereof is connected to the drain of transistor $M_1$, and the source thereof is connected to the source of transistor $M_1$; the gate of transistor $M_3$ is connected to the node PU, and the drain thereof is connected to one of the two clock signal lines to obtain the corresponding clock signal from the clock signal line, and the source thereof is connected to the output terminal of the current control sub-unit; the drain of transistor $M_4$ is connected to the source of transistor $M_3$, the source thereof is connected to the reference signal line to obtain a reference voltage.

Figure 10:
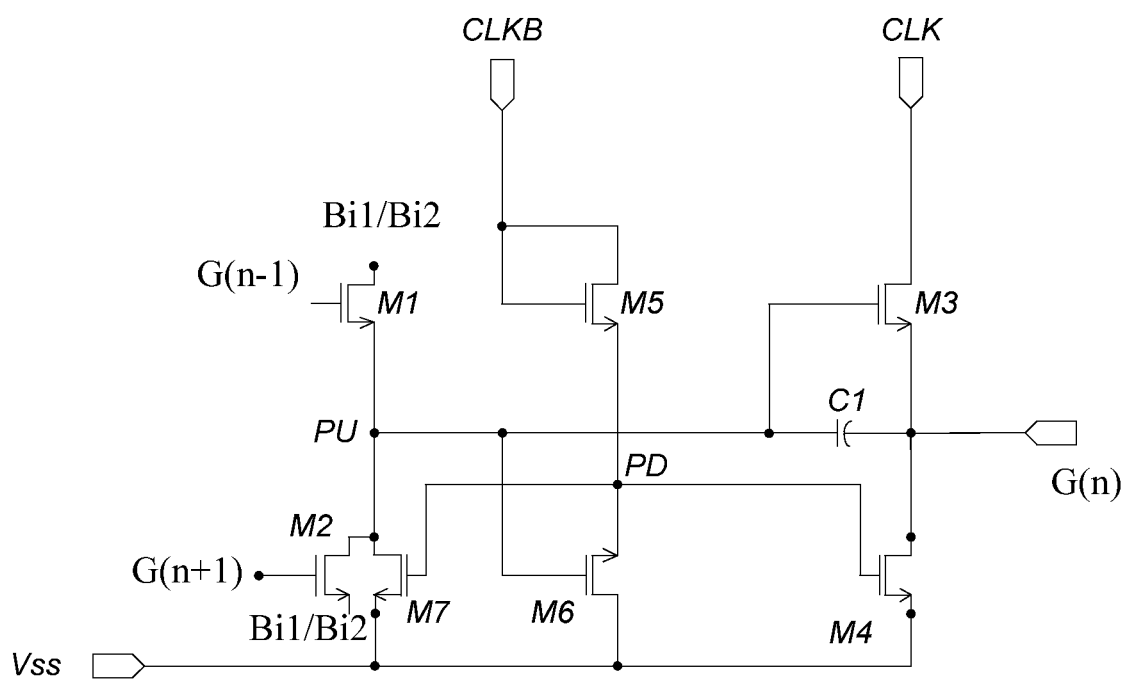
FIG. 10 is a schematic diagram showing a specific structure of a discharge circuit included in the control sub-unit in an embodiment of the disclosure.

The pull-up module can further comprise a capacitor with one terminal connected to the gate of transistor $M_3$ and the other terminal connected to the output terminal of the control sub-unit, as shown in FIG. 10.

Additionally, each control sub-unit further comprises a discharge circuit, wherein the discharge circuit is connected between the gate of transistor $M_4$ and the node PU, and is used for discharging the output terminal of the control sub-unit.

In an embodiment of the disclosure, the source of the transistor $M_1$ of the control sub-unit $U_i$ and the source of the transistor $M_1$ of the control sub-unit Ui+1 at the next stage are connected to one of the two control signal lines, and the sources of transistors $M_1$ of the control sub-units at the two succeeding stages, that is, the sources of transistors $M_1$ of the control sub-units $U_{i+2}$ and $U_{i+3}$ are connected to the other one of the two control signal lines; the drain of the transistor $M_3$ of $U_i$ is connected to one of two clock signal lines when i is an odd number, and the drain of the transistor $M_3$ of $U_i$ is connected to the other one of the two clock signal lines when i is an even number, wherein 1≤n≤N, n and N are natural numbers.

In an example, the signals on the two control signal lines have an identical period and opposite phases, and the signals on the two clock signal lines also have an identical period and opposite phases. In an embodiment of the disclosure, assuming that the signal on the control signal line has a period of 2T, then the signal on the clock signal line has a period of T.

In an embodiment of the disclosure, the above transistors $M_1$, $M_2$, $M_3$ and $M_4$ can be but not limited to Field Effect Thin Film Transistors.

In an embodiment of the disclosure, there are a first redundant control sub-unit and a second redundant control unit included, and the two redundant control sub-units are used for resetting the control sub-units connected in concatenation; the clock signals CLK and CLKB are exchanged after the reset.

It should be noted that in an embodiment of the disclosure, the gate of the transistor $M_1$ of the control sub-unit at the first stage is connected to a start pulse terminal STP to obtain a start pulse; the gate of the transistor $M_2$ of the control sub-unit at the last stage is connected to the output terminal of the second redundant control sub-unit (node $R_2$) (the particular connection can be referred to FIG. 7); after the operation is performed on each gate line according to the order in which the control sub-units are connected in concatenation, the redundant control sub-units operate, and when the node $R_2$ is at a high level, the transistor $M_2$ of the control sub-unit $U_N$ is turned on, and under the control of the control signal, the operation on each gate line is performed in a reverse order from the control sub-unit at the last stage.

In an example, the structure of the control sub-unit is not limited to the structure shown in FIG. 3, as long as it is capable of achieving the following function, that is, outputting a gate line control signal sequentially according to the control timing sequence during a first preset time period and outputting a gate line control signal according to the control timing sequence during a second preset time period in an order opposite to or identical to the order in which the gate line control signal is output during the first preset time period.

In an example, the output sub-unit 22 can be used for outputting a first gate line control signal stage by stage in an order of concatenation connection according to the control timing sequence during the first half frame of each picture to be displayed, and for outputting a second gate line control signal stage by stage in a reverse order of concatenation connection according to the control timing sequence during the latter half frame of each picture to be displayed.

In an example, the first gate line control signal can be output stage by stage in the order of concatenation connection according to the control timing sequence without the first redundant control sub-unit and the second redundant control sub-unit, wherein the gate of the transistor $M_1$ in the control sub-unit at the first stage is connected to the start pulse terminal STP to obtain a start pulse; during the second preset time period, the second gate line control signal can be output stage by stage in the order of concatenation connection according to the control timing sequence, wherein the gate of the transistor $M_1$ in the control sub-unit at the first stage is connected to the start pulse terminal STP to obtain a start pulse.

Alternatively, the gate of the transistor $M_1$ in the control sub-unit at the first stage is connected to the start pulse terminal STP to obtain a start pulse, and the first gate line control signal is output stage by stage in the order of concatenation connection according to the control timing sequence to achieve the operation on the gate line in a forward direction; the gate of the transistor $M_2$ in the control sub-unit at the last stage is connected to a reverse start pulse terminal ENDP to obtain a start pulse, and the second gate line control signal is output from the control unit at the last stage to the control unit at the first stage to achieve the operation on the gate line in a reverse direction.

Figure 4:
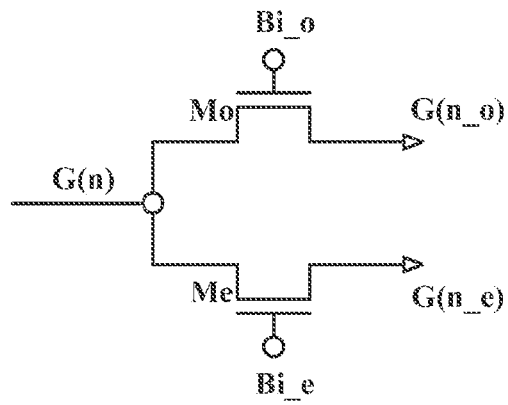
FIG. 4 is a schematic diagram showing a possible structure of an output sub-unit in an embodiment of the disclosure.

In order to achieve the above function of the output sub-unit 22, an embodiment of the disclosure provides a possible structure of the output sub-unit 22, as shown schematically in FIG. 4, the structure includes a first TFT and a second TFT, wherein drains of the first TFT and the second TFT are supplied with the gate line control signal outputted from the control sub-unit; the gate of the first TFT is supplied with a first control signal, and the gate of the second TFT is supplied with a second control signal; and the source of the first TFT supplies a first gate line control signal and the source of the second TFT supplies a second gate line control signal. For the sake of simplifying description, in FIG. 4, the first TFT is denoted as Mo, the second TFT is denoted as Me, the first control signal is denoted as Bi_o, and the second control signal is denoted as Bi_e; the gate line control signal output from the control sub-unit is denoted as G(n), wherein the first gate line control signal is denoted as G(n_o) and the second gate line control signal is denoted as G(n_e), n being a natural number.

Figure 5:
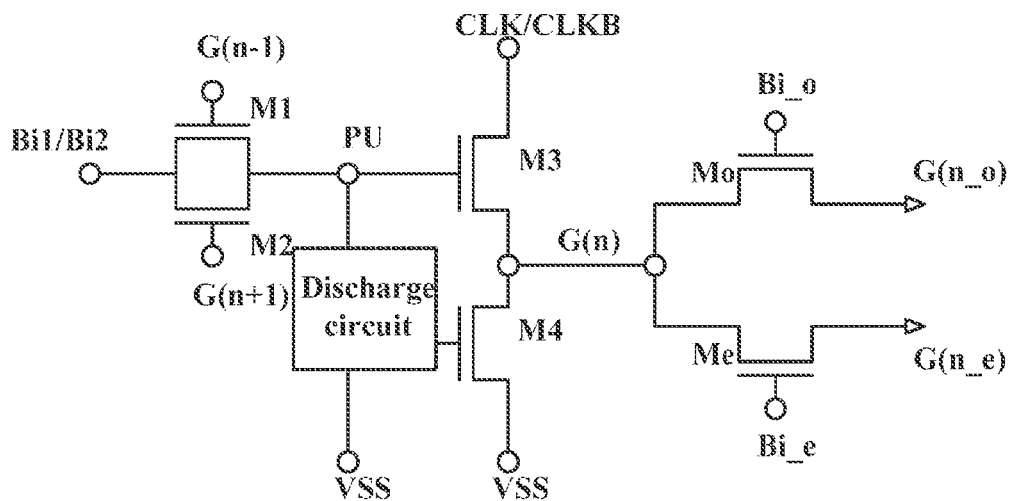
FIG. 5 is a schematic diagram showing a connection between the control sub-unit and the output sub-unit in an embodiment of the disclosure.

FIG. 5 shows a schematic diagram of the connection between the control sub-unit shown in FIG. 3 and the output sub-unit shown in FIG. 4. Since the control sub-unit and the output sub-unit shown in FIG. 5 have the same structure as those shown in FIG. 3 and FIG. 4 respectively, the detailed description thereof is omitted.

To make the embodiments of the disclosure better understand, hereinafter the operating principle of the shift register provided in the embodiments of the disclosure is explained with reference to the accompanying drawings.

Figure 6:
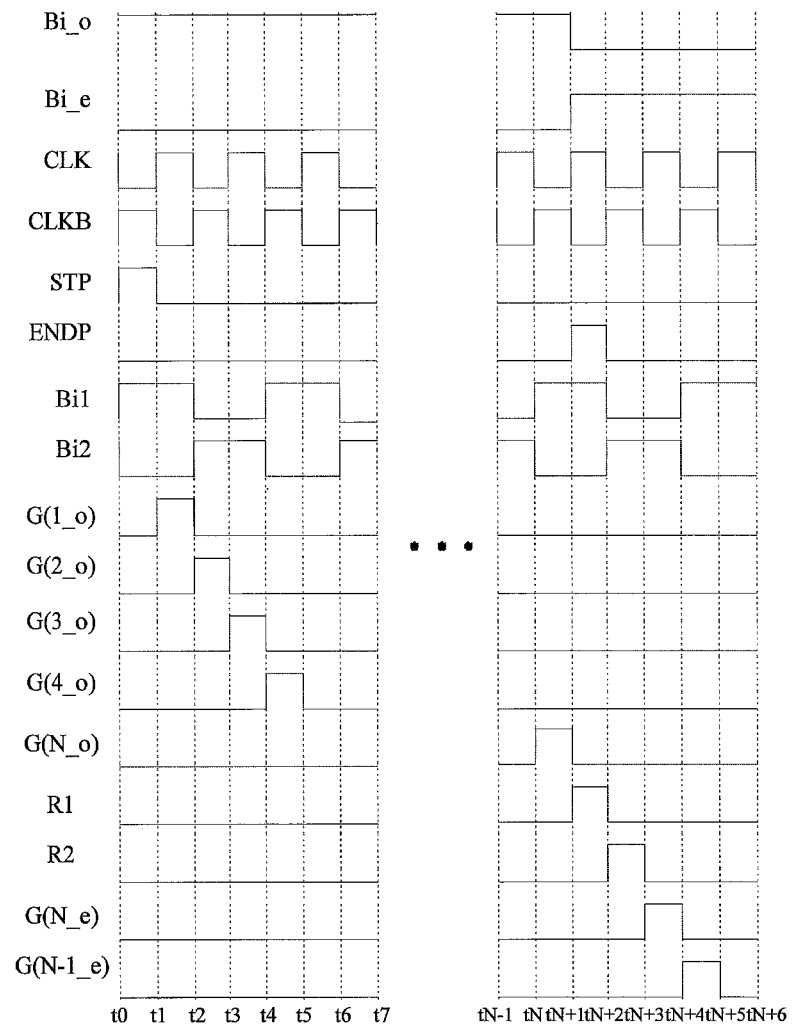
FIG. 6 is a schematic diagram showing the timing sequence of a control signal, a pulse signal, a starting pulse signal and a reset signal when a picture frame is displayed in an embodiment of the disclosure.

FIG. 6 shows a schematic diagram for the control timing sequence of the control signal, the pulse signal, the start signal and a reset signal during a frame of a picture to be displayed.

The start signal in the embodiments of the disclosure refers to a signal capable of turning on or turning off a function device, for example, the start pulse signal for the gate of the TFT; the control signal in the embodiments of the disclosure refers to a signal capable of being input to or output from the function device, e.g, the source signal of the TFT. The above function device includes the display apparatus, the shift register, the control unit, the control sub-unit, units, modules, TFTs in the embodiments of the disclosure and the like.

Figure 7A:
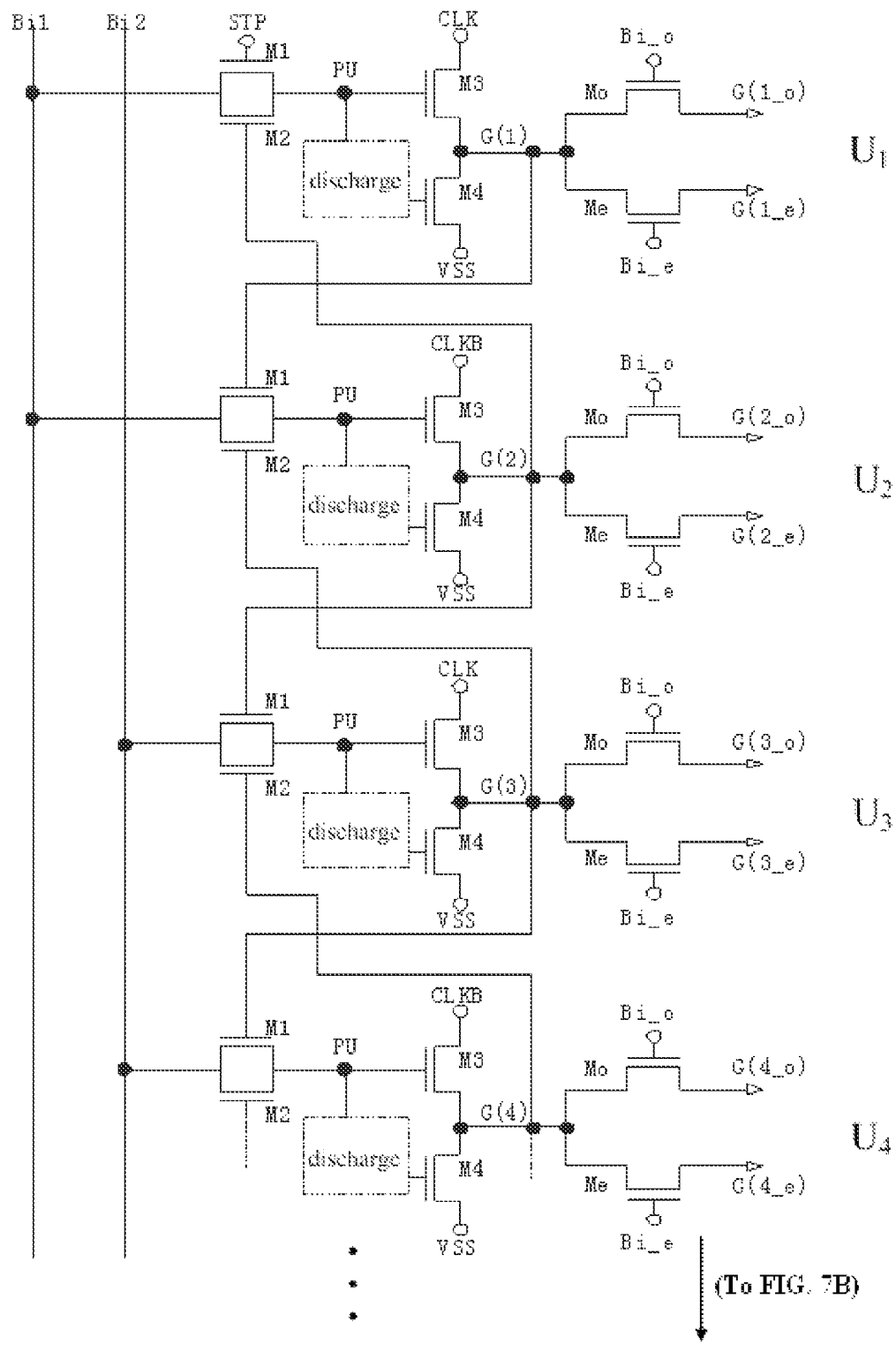
FIGS. 7A-7B are schematic diagrams showing a circuit structure corresponding to the driving procedure of a first half frame in an embodiment of the disclosure.
Figure 7B:
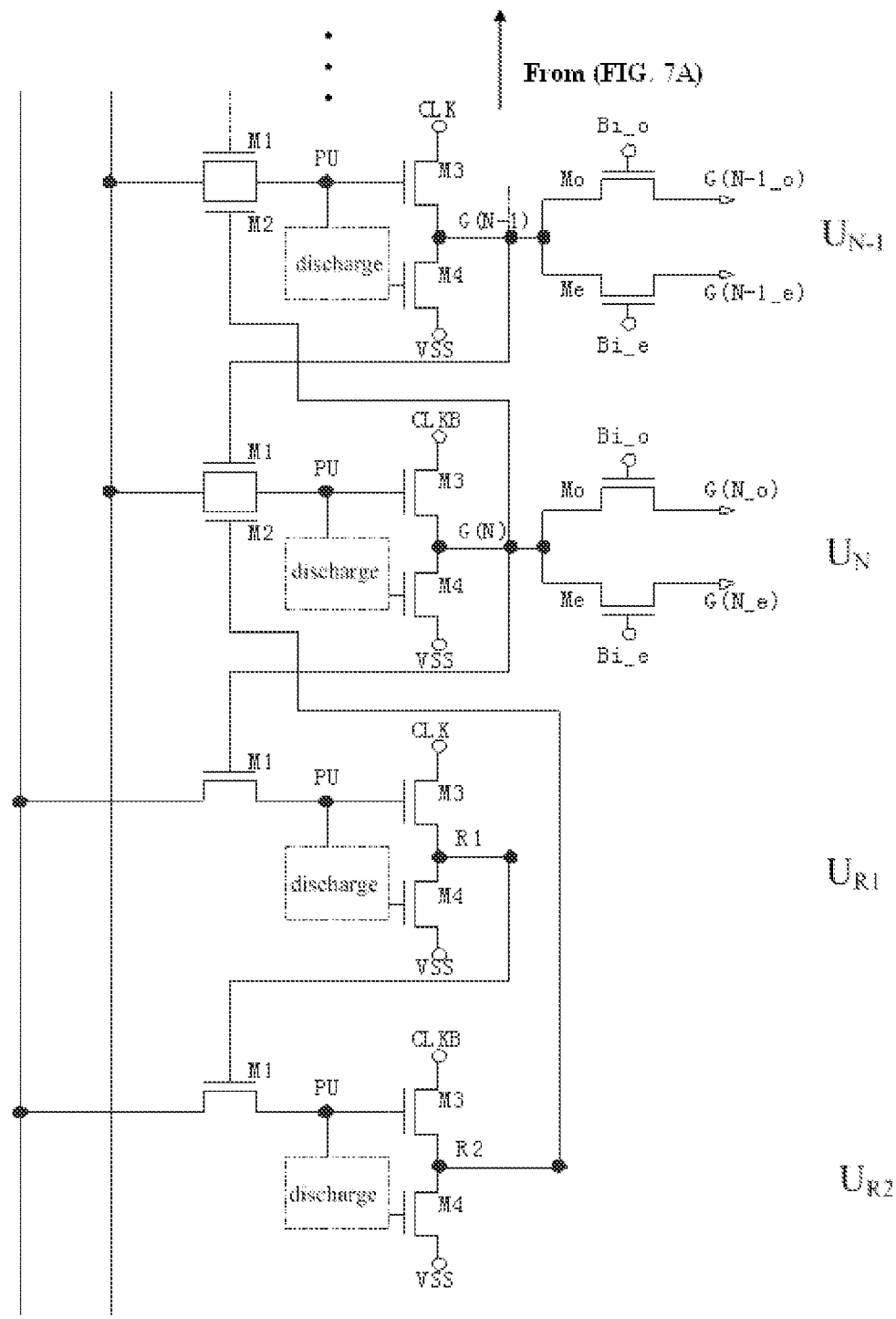

During the first half frame of each picture to be displayed, the first control signal (can also be referred to as the first start signal) is at a high level, and the second control signal (can also be referred to as the second start signal) is at a low level; and during the latter half frame of each picture to be displayed, the first control signal is at a low level, and the second control signal is at a high level. FIG. 7 shows a circuit structure corresponding to the driving procedure during the first half frame, wherein, for the sake of simplifying description, the first control signal and the second control signal are represented as Bi_o and Bi_e respectively.

During the first period ($t_0$~$t_2$), STP is at a high level, the transistor $M_1$ in the control sub-unit $U_1$ is turned on, and during the first period, Bi1 is at a high level, the potential of the node PU in $U_1$ is at a high level, and the transistor $M_3$ in $U_1$ is turned on;

During the second period ($t_1$~$t_2$), the signal CLK being supplied to the drain of transistor $M_3$ in the control sub-unit $U_1$ is at a high level, and thus the signal at the node G(1) is at a high level; and since Bi_o and Bi_e are at a high level and a low level respectively, the signal at the node G(1) can only be transmitted to the node G(1_o), and thus the operation on the first gate line control signal of the control sub-unit $U_1$ is carried out, so that the first gate line control signal of the control sub-unit $U_1$ is at a high level; meanwhile, the signal at the node G(1) is supplied to the gate of the transistor $M_1$ in the control sub-unit $U_2$ and turns on the same, and at the same time, Bi1 is still at the high level, and the potential of the node PU in the control sub-unit $U_2$ is at a high level and the transistor $M_3$ in the control sub-unit $U_2$ is turned on;

During the third period ($t_2$~$t_3$), the signal CLKB being supplied to the drain of the transistor $M_3$ in the control sub-unit $U_2$ is at a high level, and is transmitted to the node G(2) via the transistor $M_3$ in the control sub-unit $U_2$. Then, since Bi_o and Bi_e are at the high level and the low level respectively, the signal at the node G(2) can only be transmitted to the node G(2_o), and thus the operation on the first gate line control signal of the control sub-unit $U_2$ is carried out, so that the first gate line control signal of the control sub-unit $U_2$ is at a high level; meanwhile, the signal with high level at the node G(2) is further supplied to the gate of the transistor $M_2$ in the control sub-unit $U_1$ and turns on the same; however, at this time, Bi1 is at a low level so that the node PU in the control sub-unit $U_1$ is at a low level, and thus the reset function on the control sub-unit $U_1$ is achieved; in addition, the signal with high level at the node G(2) makes the voltage at the node PU in the control sub-unit $U_1$ decrease, so that the transistor $M_4$ in the control sub-unit $U_1$ is turned on under the control of a discharge circuit, and thus the first gate line control signal of the control sub-unit $U_1$ is at a low level; that is, the discharge circuit in the control sub-unit $U_1$ can discharge the node PU therein and the node G(1) to make the first gate line control signal of the control sub-unit $U_1$ be at a low level; meanwhile, the signal with high level at the node G(2) is further supplied to the transistor $M_1$ in the control sub-unit $U_3$ and turns on the same; at this time, since the Bi2 connected to the drain of the transistor $M_1$ in the control sub-unit $U_3$ is at a high level, the node PU in the control sub-unit $U_3$ is at a high level, and the transistor $M_3$ in the control sub-unit $U_3$ is turned on;

During the fourth period ($t_3$~$t_4$), the signal CLK being supplied to the drain of the transistor $M_3$ in the control sub-unit $U_3$ is at a high level, and is transmitted to the node G(3). Similarly, since Bi_o and Bi_e are at the high level and the low level respectively, the signal at the node G(3) can only be transmitted to the node G(3_o), and thus the operation on the first gate line control signal of the control sub-unit $U_3$ is carried out, so that the first gate line control signal of the control sub-unit $U_3$ is at a high level; meanwhile, the signal with high level at the node G(3) is further supplied to the gate of the transistor $M_2$ in the control sub-unit $U_2$ and turns on the same; however, at this time, Bi1 is at a low level so that the node PU in the control sub-unit $U_2$ is at a low level; the discharge circuit in the control sub-unit $U_2$ discharges the node PU therein and the node G(2) to make the first gate line control signal of the control sub-unit $U_2$ be at a low level; meanwhile, the signal with high level at the node G(3) is further supplied to the transistor $M_1$ in the control sub-unit $U_4$ and turns on the same; at this time, since the Bi2 connected to the drain of the transistor $M_1$ in the control sub-unit $U_4$ is at a high level, the node PU in the control sub-unit $U_4$ is at a high level, and the transistor $M_3$ in the control sub-unit $U_4$ is turned on;

During the fifth period ($t_4$~$t_5$), the signal CLKB being supplied to the drain of the transistor $M_3$ in the control sub-unit $U_4$ is at a high level, and is transmitted to the node G(4). Similarly, since Bi_o and Bi_e are at the high level and the low level respectively, the signal at the node G(4) can only be transmitted to the node G(4_o), and thus the operation on the first gate line control signal of the control sub-unit $U_4$ is carried out, so that the first gate line control signal of the control sub-unit $U_4$ is at a high level; meanwhile, the signal with high level at the node G(4) is further supplied to the gate of the transistor $M_2$ in the control sub-unit $U_3$ and turns on the same; however, at this time, Bi2 is at a low level so that the node PU in the control sub-unit $U_3$ is at a low level; the discharge circuit in the control sub-unit $U_3$ discharges the node PU therein and the node G(3) to make the first gate line control signal of the control sub-unit $U_3$ be at a low level; meanwhile, the signal with high level at the node G(4) is further supplied to the transistor $M_1$ in the control sub-unit $U_5$ and turns on the same; at this time, since the Bi1 connected to the drain of the transistor $M_1$ in the control sub-unit $U_5$ is at a high level, the node PU in the control sub-unit $U_5$ is at a high level, and the transistor $M_3$ in the control sub-unit $U_5$ is turned on;

and so forth . . . ;

During the $(N+1)^{th}$ period ($t_N$~$t_{N+1}$), the operation on the first gate line control signal of the control sub-unit $U_N$ is carried out.

Thus, by the above procedure, the operation on the first gate line control signal of each shift register unit is performed.

During the next two periods ($t_{N+1}$~$t_{N+2}$ and $t_{N+2}$~$t_{N+3}$), the first redundant control sub-unit UR1 and the second redundant control unit UR2 are in operation, and since none of them is connected to a gate line, the description thereof is omitted in the embodiments of the disclosure.

In an example, the gate of the transistor $M_4$ and the gate of the transistor $M_2$ are connected to the same signal line. That is, the gate control signal for the control sub-unit can also be connected to the gate of the transistor $M_4$ in the control sub-unit at the previous stage, so that the node PU and the gate control signal of the control sub-unit at the previous stage are pulled down, which achieves a reset function. At this time, the discharge circuit is not necessary any more.

In an example, the connection of Bi1 and Bi2 are not limited to that shown in FIG. 7, and an alternate connection can also be possible, as long as the control signal line connected to the source of the transistor $M_1$ in the control sub-unit at the current stage in two adjacent stages is at a high level when the control sub-unit at the previous stage in the two adjacent stages outputs the gate line control signal.

Figure 8A:
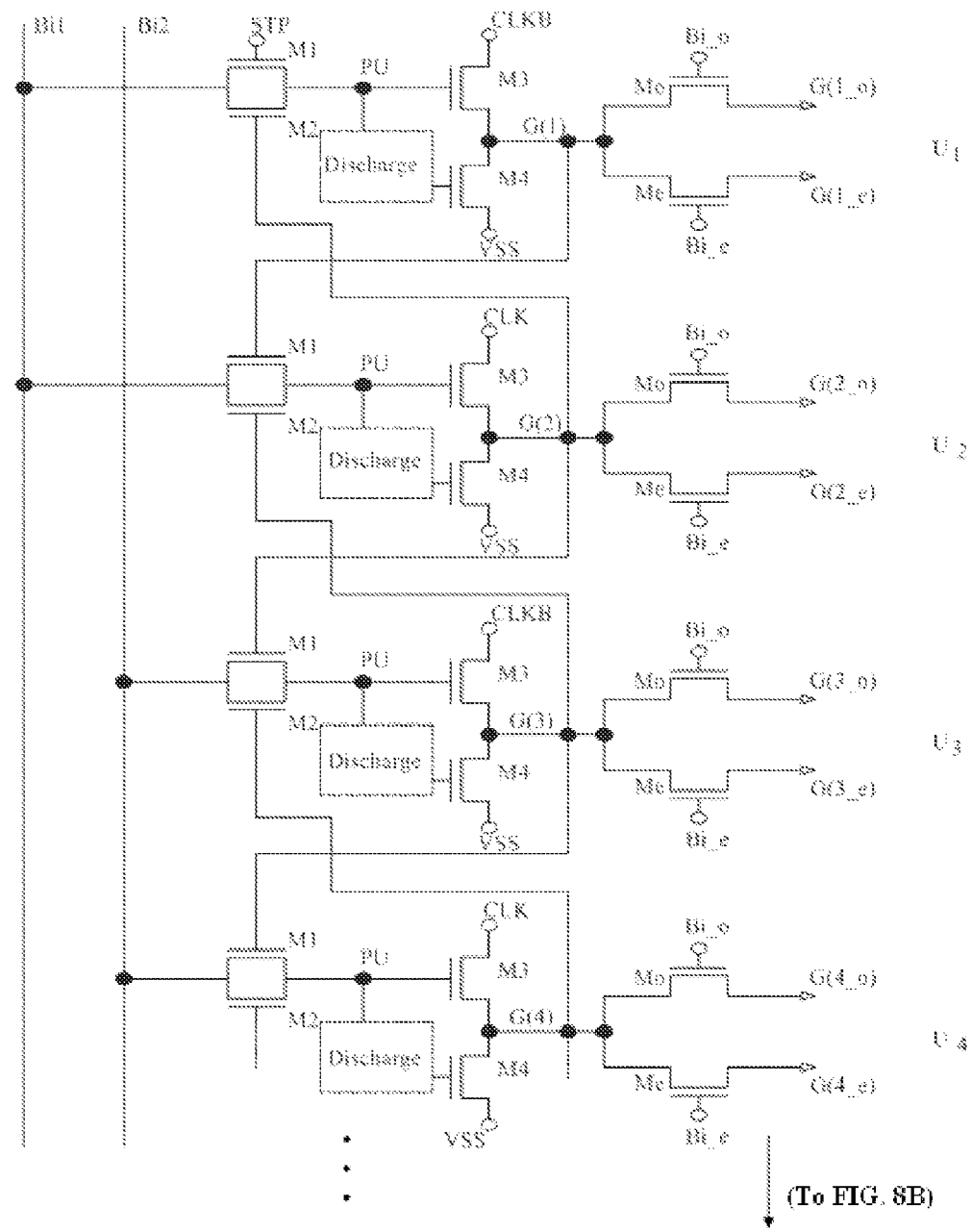
FIGS. 8A-8B are schematic diagrams showing a circuit structure corresponding to the driving procedure of a latter half frame in an embodiment of the disclosure.
Figure 8B:
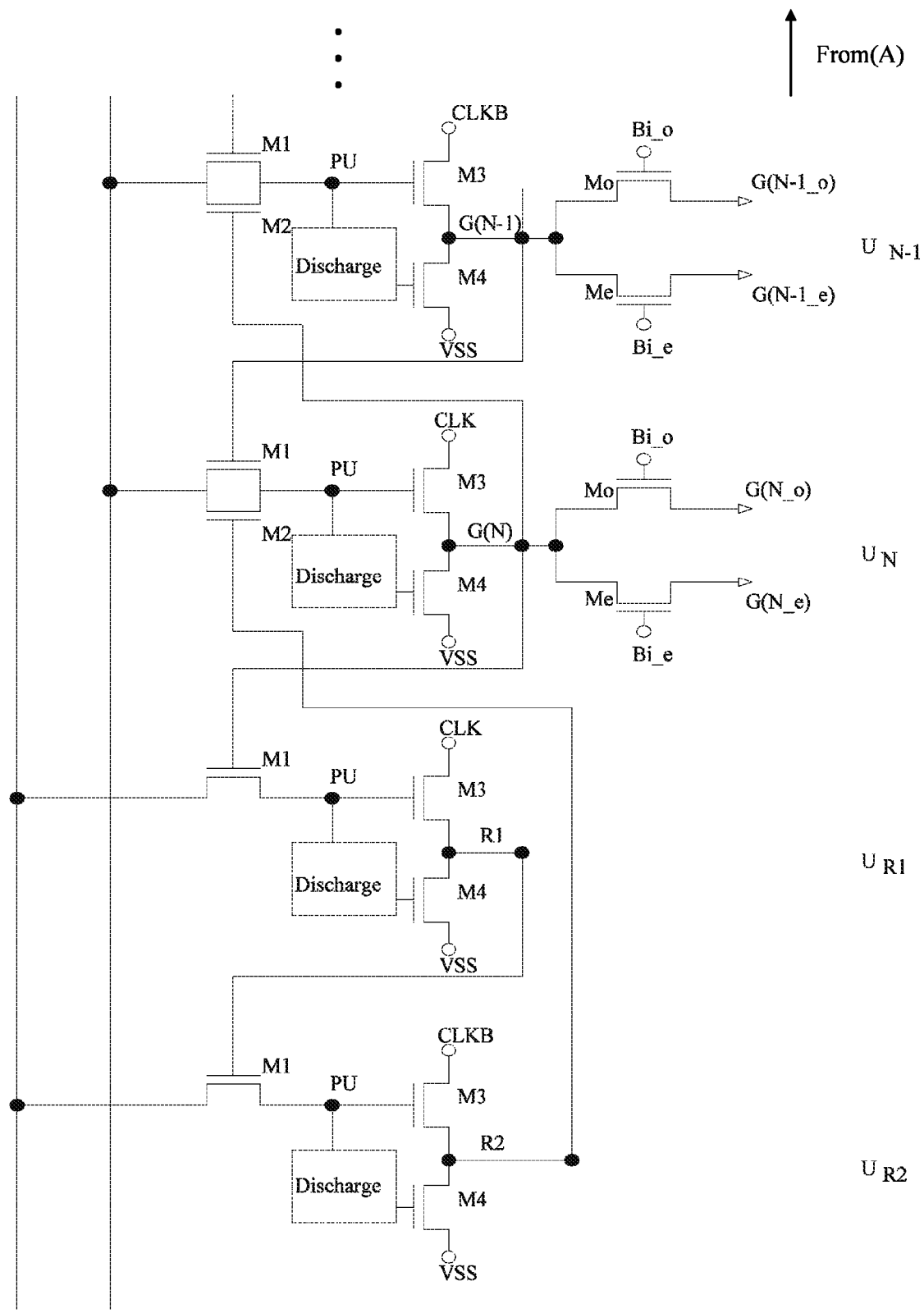

Next, the driving procedure for the latter half frame is performed, wherein the signals CLK and CLKB are exchanged, and Bi_o and Bi_e are at a low level and a high level respectively. FIG. 8 schematically shows a circuit structure corresponding to the driving procedure.

During the period $t_{N+2}$~$t_{N+3}$, the signal at the node $R_2$ is at a high level and is transmitted to the gate of the transistor $M_2$ in the control sub-unit $U_N$ to turn on the same;

During the period $t_{N+3}$~$t_{N+4}$, the Bi2 connected to the drain of the transistor $M_2$ in the control sub-unit $U_N$ is at a high level, so that the node PU in the control sub-unit $U_N$ is at a high level, and thus the transistor $M_3$ in the control sub-unit $U_N$ is turned on and a high level pulse of the CLK is transmitted to the node G(N); since Bi_o and Bi_e are at the low level and the high level respectively, the signal at the node G(N) can only be transmitted to the node G(N_e), and thus the operation on the second gate line control signal of the control sub-unit $U_N$ is carried out, so that the second gate line control signal of the control sub-unit $U_N$ is at a high level; meanwhile, the signal with high level at the node G(N) is supplied to the gate of the transistor $M_2$ in the control sub-unit $U_{N-1}$ and turns on the same; at this time, Bi2 is at a high level so that the node PU in the control sub-unit $U_{N-1}$ is at a high level to turn on the transistor $M_3$ in the control sub-unit $U_{N-1}$;

During the next period $t_{N+4}$~$t_{N+5}$, a high level pulse of CLKB is transmitted to the node G(N-1) via the transistor $M_3$ in the control sub-unit $U_{N-1}$; Similarly, since Bi_o and Bi_e are at the low level and the high level respectively, the signal at the node G(N-1) can only be transmitted to the node G(N-1_e), and thus the operation on the second gate line control signal of the control sub-unit $U_{N-1}$ is carried out, so that the second gate line control signal of the control sub-unit $U_{N-1}$ is at a high level; meanwhile, the signal with high level at the node G(N-1) is supplied to the gate of the transistor $M_1$ in the control sub-unit $U_N$ and turns on the same; however, at this time, since Bi2 is at a low level, the node PU in the control sub-unit $U_N$ is at a low level; thus, the discharge circuit in the control sub-unit $U_N$ discharges the node PU therein and the node G(N); meanwhile, the signal with high level at the node G(N-1) is further supplied to the transistor $M_2$ in the control sub-unit $U_{N-2}$ and turns on the same; at this time, since the Bi1 is at a high level, the node PU in the control sub-unit $U_{N-2}$ is at a high level, and the transistor $M_3$ in the control sub-unit $U_{N-2}$ is turned on;

and so on . . . ;

During the period ($t_{2N+2}$~$t_{2N+3}$), the operation on the second gate line control signal of the control sub-unit $U_1$ is carried out.

Thus, by the above procedure, the operation on the second gate line control signal of each control sub-unit is implemented.

So far, the scanning for two gate lines corresponding to each of all the control sub-units is carried out.

In an example, each control sub-unit G(n) is connected to two gate lines, wherein a first gate line control signal is denoted as G(n_o) and supplied to odd rows of gate lines, and a second gate line control signal is denoted as G(n_e) and supplied to even rows of gate lines.

Figure 9:
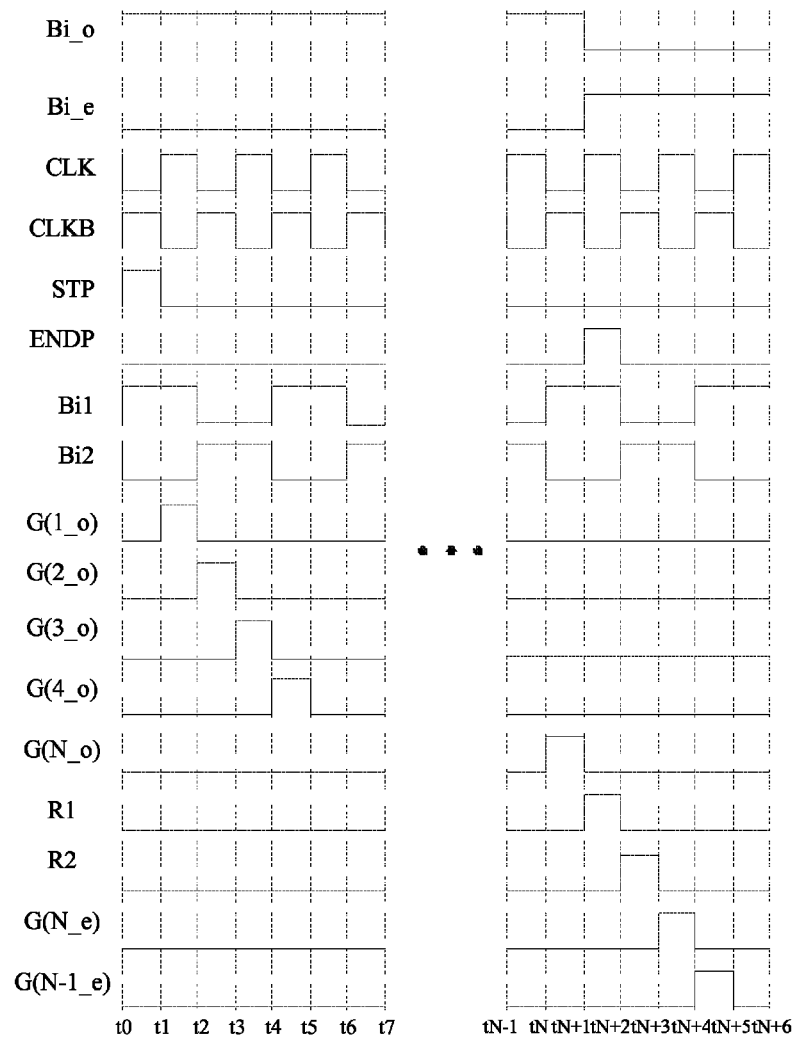
FIG. 9 is a schematic diagram of the outputs of a first gate line control signal and a second gate line control signal under each control timing sequence according to an embodiment of the disclosure.

FIG. 9 shows a schematic diagram of the outputs of the first gate line control signal and the second gate line control signal in each control time period corresponding to the timing sequence shown in FIG. 6.

In an example, there can be a plurality of implementations according to different timing sequences; for example, the first preset time period and the second preset time period both can be one frame period, wherein a forward scanning is performed during the first preset time period and the signals of Mo and Me can be output simultaneously during a cycle of CLK, and thus one GOA can output the signals for two gate lines at the same frequency; alternatively, the signals of Mo and Me can be output in sequence (or in alternate) during a cycle of CLK according to the cooperation of Bi_o and Bi_e, and thus one GOA can output the signals for two gate lines one after the other, and the progressive scanning can also be achieved; compared to the bi-side driving circuit, the technical solution of the embodiment of the disclosure saves the space for wiring; during the second preset time period, a reverse scanning is performed.

In an example, a discharge circuit is connected between a discharge signal terminal, a first node as the pull up node (node PU) and the gate of the transistor M4, and is further connected to the reference signal line (that is, the reference voltage signal line, the reference signal VSS, or the low level signal terminal), for controlling the transistor M4 to be turned on so as to maintain the gate control signal output from the control sub-unit in the current stage at a low level. The discharge circuit can adopt but not be limited to the structure shown in FIG. 10.

As shown in FIG. 10, the discharge circuit comprises:

a fifth TFT M5 having a gate and a drain connected together to the discharge signal terminal, and a source connected to a second node as the pull down node (node PD); and a sixth TFT M6 having a gate connected to the first node, a drain connected to the second node, and a source connected to the low level signal terminal;

wherein the gate of the transistor M4 is connected to the second node.

The discharge circuit can further comprise:

a seventh TFT M7 having a gate connected to the second node, a drain connected to the first node, and a source connected to the low level signal terminal;

wherein the discharge signal terminal can supply a direct current high level signal, such as the signal CLKB, the signal CLKB and the clock signal CLK of the control sub-unit at the current stage have the same period but opposite phases. For example, it is possible to supply the clock signal CLK of the control sub-unit at the current stage to the discharge signal terminal directly if an inverter is inserted between the clock signal CLK of the control sub-unit at the current stage and the fifth TFT M5.

The TFT $M_1$ functions as the first control module, the TFT $M_2$ functions as the second control module, the TFT $M_3$ functions as the pull up module, and the TFT $M_4$ functions as the pull down module; wherein the pull up module can further comprise a capacitor, the capacitor having one terminal connected to the gate of the TFT $M_3$ and the other terminal connected to the output terminal of the control sub-unit.

Based on the same inventive concept, an embodiment of the disclosure further provide a method for driving the shift register, an array substrate and a display apparatus. Since the principle of the method, the array substrate and the display apparatus for solving the technical problems is similar to that of the shift register, the implementations thereof can be referred to the implementation of the shift register and the repetitive descriptions are omitted.

Figure 11:
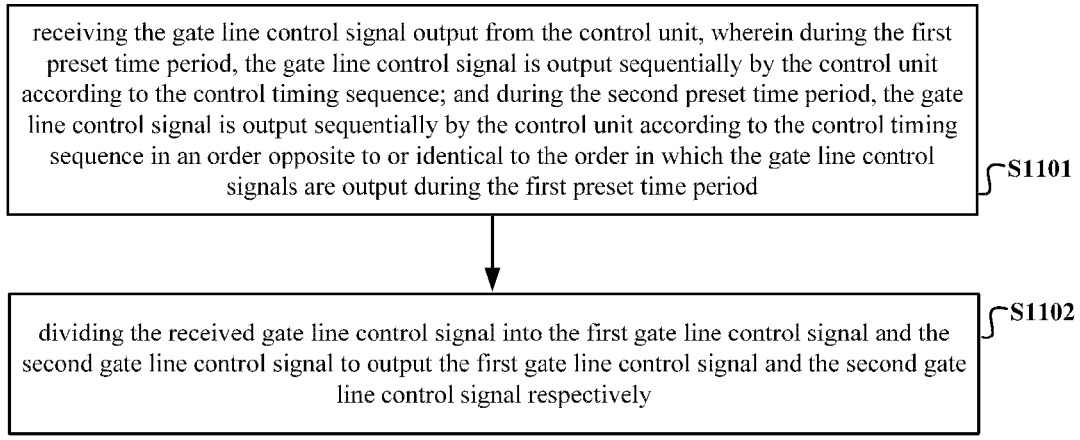
FIG. 11 is a schematic diagram showing a flow for implementing the method for driving the shift register in an embodiment of the disclosure.

FIG. 11 shows a schematic flow chart of the method for driving the shift register provided in the embodiment of the disclosure, wherein the method comprises the steps of:

S1101, receiving the gate line control signal output from the control unit, wherein during the first preset time period, the gate line control signal is output sequentially by the control unit according to the control timing sequence; and during the second preset time period, the gate line control signal is output sequentially by the control unit according to the control timing sequence in an order opposite to or identical to the order in which the gate line control signals are output during the first preset time period; and S1102, dividing the received gate line control signal into the first gate line control signal and the second gate line control signal to output the first gate line control signal and the second gate line control signal respectively.

In an example, during the first preset time period, the first gate line control signal is output sequentially according to the control timing sequence; and during the second preset time period, the second gate line control signal is output sequentially according to the control timing sequence in an order opposite to or identical to the order in which the first gate line control signal is output during the first preset time period.

In an example, the shift register provided in the embodiments of the disclosure can be arranged in an array substrate.

In addition, an embodiment of the disclosure further provides a display apparatus including a color film substrate, an array substrate and the liquid crystal between the color film substrate and the array substrate, wherein the array substrate includes the shift register provided in the embodiments of the disclosure.

In the shift register, the method for driving the same, the array substrate and the display apparatus provided in the embodiments of the disclosure, the shift register comprises the control sub-units and the output sub-units, wherein the control sub-units are used for outputting the gate line control signals stage by stage in an order of concatenation connection according to the control timing sequence during the first preset time period, and for outputting the gate line control signals stage by stage according to the control timing sequence in an order opposite to or identical to the order of concatenation connection during the second preset time period; the output sub-unit are used for dividing the gate line control signals output from the control sub-unit into two gate line control signals and outputs the two gate line control signals respectively. Thus, one control sub-unit can control two gate line signals, thus reducing the space for wiring as required by the shift register.

In an example, the display apparatus can be a liquid crystal panel, an electronic paper, an OLED panel, a mobile phone, a tablet personal computer, a television set, a display, a laptop, a digital photo frame, a navigator, and the like or any product or component having a displaying function.

Obviously, those skilled in the art can make various modifications and variants to the embodiments of the disclosure without departing from the scope and the spirit of the disclosure. Thus, provided that these modifications and variants belong to the scope of the claims of the disclosure and their equivalences, these modifications and variants are intended to be contained in the disclosure.

What is claimed is:

1. A shift register comprising a control unit and a plurality of output sub-units, wherein
the control unit comprises a plurality of control sub-units connected in concatenation and a reset unit, each of the control sub-units has an output terminal, the output terminals of the plurality of control sub-units output gate line control signals sequentially in a forward scanning direction according to the control timing sequence during a first half frame of each picture to be displayed, and output gate line control signals sequentially in a backward scanning direction according to the control timing sequence during a second half frame of each picture to be displayed;
each of the output sub-units is connected to a corresponding output terminal of the control unit, and divides the gate line control signal output from the connected output terminal into at least a first gate line control signal and a second gate line control signal to output the first gate line control signal and the second gate line control signal respectively,
wherein the reset unit comprises two cascaded reset sub-units, an output terminal of the second reset sub-unit in the two cascaded reset sub-units is connected to a reset terminal of the control sub-unit at a last stage in the plurality of control sub-units, and an input terminal of the first reset sub-unit in the two cascaded reset sub-units is connected to the output terminal of the control sub-unit at the last stage in the plurality of control sub-units, and the reset unit is configured to input a start signal to the reset terminal of the control sub-unit at the last stage in the plurality of control sub-units after the first half frame of each picture to be displayed ends, so that the control unit changes from the forward scanning direction to the backward scanning direction.

2. The shift register of claim 1, wherein the output sub-units output the first gate line control signal sequentially in the forward scanning direction according to the control tiring sequence during the first half frame of each picture to be displayed, and output the second gate line control signal sequentially in the backward scanning direction according to the control timing sequence during the second half frame of each picture to be displayed.

3. The shift register of claim 1, wherein the output sub-unit comprises a first Thin Film Transistor TFT and a second TFT, wherein drains of the first TFT and the second TFT are supplied with the gate line control signal output from the control sub-unit;
   a gate of the first TFT is supplied with a first control signal;
   a gate of the second TFT is supplied with a second control signal;
   a source of the first TFT supplies the first gate line control signal; and
   a source of the second TFT supplies the second gate line control signal.

4. The shift register of claim 3, wherein
   during the first half frame of each picture to be displayed, the first control signal is at a high level, and the second control signal is at a low level; and
   during the second half frame of each picture to be displayed, the first control signal is at a low level, and the second control signal is at a high level.

5. The shift register of claim 1, wherein each control sub-unit comprises:
   a first control module for controlling a pull-up module to be turned on or off, wherein in the forward scanning, the first control module turns on or turns off the pull-up module according to a gate line control signal output from the control sub-unit at the previous stage; in the reverse scanning, the first control module turns on or turns off the pull-up module according to a gate line control signal output from the control sub-unit at the next stage;
   a second control module for controlling the pull-up module to be turned on or off, wherein in the reverse scanning, the second control module turns on or turns off the pull-up module according to a gate line control signal output from the control sub-unit at the previous stage; in the forward scanning, the second control module turns on or turns off the pull-up module according to a gate line control signal output from the control sub-unit at the next stage;
   the pull-up module for outputting a clock signal to an output terminal of the control sub-unit under the control of the second control module or the first control module; and
   a pull-down module for pulling down a gate line control signal output from the output terminal of the control sub-unit to a reference signal.

6. The shift register of claim 5, wherein each control sub-unit further includes a discharge circuit for controlling the pull down module to pull down the gate line control signal output from the output terminal of the control sub-unit to the reference signal.

7. The shift register of claim 1, wherein the reset sub-units in the reset unit have the same structure as the control sub-units in the plurality of the control sub-units.

8. A method for driving the shift register of claim 1, comprising the steps of:
   during the first half frame of each picture to be displayed, outputting sequentially by the control unit according to the control timing sequence the gate line control signals in the forward scanning direction, and outputting the gate line control signals by the output sub-units as the first gate line control signals;
   inputting a start signal by the reset unit to the control unit, such that the control unit changes from the forward scanning direction to the backward scanning direction;
   during the second half frame of each picture to be displayed, outputting sequentially by the control unit according to the control timing sequence the gate line control signals in the backward scanning direction, and outputting the gate line control signals by the output sub-units as the second gate line control signals.

9. An array substrate comprising the shift register of claim 1.

10. The array substrate of claim 9, wherein the output sub-units output the first gate line control signal sequentially in the forward scanning direction according to the control timing sequence during the first half frame of each picture to be displayed, and output the second gate line control signal sequentially in the backward scanning direction according to the control timing sequence during the second half frame of each picture to be displayed.

11. The array substrate of claim 9, wherein the output sub-unit comprises a first Thin Film Transistor TFT and a second TFT, wherein drains of the first TFT and the second TFT are supplied with the gate line control signal output from the control sub-unit;
   a gate of the first TFT is supplied with a first control signal;
   a gate of the second TFT is supplied a second control signal;
   a source of the first TFT supplies the first gate line control signal; and
   a source of the second TFT supplies with the second gate line control signal.

12. The array substrate of claim 9, wherein each control sub-unit comprises:
   a first control module for controlling a pull-up module to be turned on or off, wherein in the forward scanning, the first control module turns on or turns off the pull-up module according to a gate line control signal output from the control sub-unit at the previous stage; in the reverse scanning, the first control module turns on or turns off the pull-up module according to a gate line control signal output from the control sub-unit at the next stage;
   a second control module for controlling the pull-up module to be turned on or off, wherein in the reverse scanning, the second control module turns on or turns off the pull-up module according to a gate line control signal output from the control sub-unit at the previous stage; in the forward scanning, the second control module turns on or turns off the pull-up module according to a gate line control signal output from the control sub-unit at the next stage;
   the pull-up module for outputting a clock signal to an output terminal of the control sub-unit under the control of the second control module or the first control module; and
   a pull-down module for pulling down a gate line control signal output from the output terminal of the control sub-unit to a reference signal.

13. The array substrate of claim 12, wherein each control sub-unit further includes a discharge circuit for controlling the pull down module to pull down the gate line control signal output from the output terminal of the control sub-unit to the reference signal.

14. The array substrate of claim 9, wherein the reset sub-units in the reset unit have the same structure as the control sub units in the plurality of the control sub-units.

\* \* \* \* \*